United States Patent
Fukuhara (10) Patent No.: US 10,451,685 B2
(45) Date of Patent: Oct. 22, 2019

(54) SECONDARY BATTERY SYSTEM AND METHOD FOR IDENTIFYING ABNORMALITY OF SECONDARY BATTERY SYSTEM

(71) Applicant: NGK INSULATORS, LTD., Nagoya (JP)

(72) Inventor: Motohiro Fukuhara, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 778 days.

(21) Appl. No.: 14/990,086

(22) Filed: Jan. 7, 2016

(65) Prior Publication Data

US 2016/0116545 A1   Apr. 28, 2016

Related U.S. Application Data

(63) Continuation of application No. PCT/JP2014/068504, filed on Jul. 10, 2014.

(30) Foreign Application Priority Data

Jul. 11, 2013   (JP) .................................. 2013-145429

(51) Int. Cl.

| | |
|---|---|
| *G01R 31/396* | (2019.01) |
| *H01M 10/48* | (2006.01) |
| *H02J 7/00* | (2006.01) |
| *H01M 10/42* | (2006.01) |
| *G01R 19/165* | (2006.01) |

(Continued)

(52) U.S. Cl.

CPC ..... *G01R 31/396* (2019.01); *G01R 19/16542* (2013.01); *G01R 31/3842* (2019.01);

(Continued)

(58) Field of Classification Search

CPC .......... G01R 19/16542; G01R 31/3658; G01R 31/362; G01R 31/3689; G01R 31/3682;

(Continued)

(56) References Cited

U.S. PATENT DOCUMENTS

| | | | |
|---|---|---|---|
| 6,453,249 B1* | 9/2002 | Shibutani ........... | G01R 31/3679 320/132 |
| 2005/0275407 A1* | 12/2005 | Yumoto ............. | G01R 31/3624 324/426 |

(Continued)

FOREIGN PATENT DOCUMENTS

| | | |
|---|---|---|
| EP | 2 110 679 A1 | 10/2009 |
| EP | 2 428 809 A2 | 3/2012 |

(Continued)

OTHER PUBLICATIONS

Extended European Search Report (Application No. 14822929.7) dated Jan. 31, 2017.

(Continued)

*Primary Examiner* — Son T Le
*Assistant Examiner* — Dustin R Dickinson
(74) *Attorney, Agent, or Firm* — Burr & Brown, PLLC (57) ABSTRACT

A voltage measurement unit for detecting voltage of secondary battery cells on a block by block basis, and outputting the detected voltage as block voltage, an information acquisition unit for acquiring information about a module among a plurality of modules that accommodates a block where a difference between the block voltage and a corresponding block voltage with a first order lag has been changed to exceed a predetermined voltage value, a notification reception unit for receiving a notification of an abnormality having occurred in the secondary battery cells, and a module identification unit for identifying a module corresponding to the information about the module, as a module having the abnormality at the time of receiving the notification by the notification reception unit, are provided.

10 Claims, 8 Drawing Sheets

(51) Int. Cl.
  *G01R 31/3842* (2019.01)
  *G01R 31/371* (2019.01)
  *G01R 31/392* (2019.01)

(52) U.S. Cl.
  CPC ....... *H01M 10/4285* (2013.01); *H01M 10/48* (2013.01); *H01M 10/482* (2013.01); *H01M 10/488* (2013.01); *H02J 7/0021* (2013.01); *H02J 7/0029* (2013.01); *G01R 31/371* (2019.01); *G01R 31/392* (2019.01); *H01M 2010/4271* (2013.01); *H01M 2010/4278* (2013.01)

(58) Field of Classification Search
  CPC .............. G01R 31/3686; G01R 31/3624; G01R 31/44; H01M 10/482; H01M 10/48; H01M 10/4285; H01M 10/488; H01M 10/4207; H01M 2010/4271; H01M 2010/4278; H02J 7/0021; H02J 7/0029
  See application file for complete search history.

(56) References Cited

U.S. PATENT DOCUMENTS

| 2012/0212871 | A1  | 8/2012 | Taniguchi |
| 2013/0082661 | A1* | 4/2013 | Bohan, Jr. ......... H01M 10/4221 320/134 |
| 2013/0110430 | A1  | 5/2013 | Nishi et al. |

FOREIGN PATENT DOCUMENTS

| JP | 03-158781 A1 | 7/1991 |
| JP | 2012-088097 A1 | 5/2012 |
| WO | 2011/148592 A1 | 12/2011 |

OTHER PUBLICATIONS

International Search Report and Written Opinion (Application No. PCT/JP2014/068504) dated Sep. 9, 2014.

* cited by examiner

| DATE (YEAR, MONTH, DAY) | TIME (HOUR, MINUTE) | MODULE STRING INFORMATION | MODULE INFORMATION | BLOCK INFORMATION | PRESENT BLOCK VOLTAGE VALUE |

FIG. 8

SECONDARY BATTERY SYSTEM AND METHOD FOR IDENTIFYING ABNORMALITY OF SECONDARY BATTERY SYSTEM

CROSS-REFERENCE TO RELATED APPLICATIONS

This application is a Continuation of International Application No. PCT/JP2014/068504 filed on Jul. 10, 2014, which was published under PCT Article 21(2) in Japanese, which is based upon and claims the benefit of priority from Japanese Patent Application No. 2013-145429 filed on Jul. 11, 2013, the contents all of which are incorporated herein by reference.

BACKGROUND OF THE INVENTION

Field of the Invention

The present invention relates to an apparatus, method, and a non-transitory recording medium for identifying a position of an abnormality having occurred in a secondary battery system including two or more modules each formed by accommodating one or more blocks in a casing. Each of the blocks is formed by connecting two or more secondary battery cells.

Description of the Related Art

In general, frequency adjustment in an electric power system and adjustment of power demand and power supply in the electric power system are carried out using a plurality of power generators, storage batteries, etc., equipped in the electric power system. Further, in most cases, adjustment in difference between electric power generated by natural energy power generators and the planned output electric power, and reduction in change of electric power generated by the natural energy power generators are also performed using the power generators, storage batteries, etc. In comparison with general electric power generators, the storage batteries can change the electric power output at high speed, and thus is effective in frequency adjustment of the electric power system, adjustment of the difference between the generated electric power from the natural energy power generators and the planned output electric power, and adjustment of power demand and power supply in the electric power system.

In this regard, as a high-temperature operation type storage battery connected to the electric power system, a sodium-sulfur battery (hereinafter referred to as the NaS battery) is used, for example. This NaS battery is a high temperature type secondary battery containing metal sodium and sulfur as active materials in an isolated manner using a solid electrolyte tube. When the NaS battery is heated at high temperature of about 300° C., a certain amount of energy is produced by an electrochemical reaction of both of the melted active materials of these metal sodium and sulfur. Normally, the NaS battery is formed by assembling a plurality of battery cells, and used in a form of a module including a plurality of battery cells connected together. That is, the module has a structure where circuits (strings) each formed by connecting a plurality of battery cells in series are connected in parallel to form a block, and at least two blocks are connected in series, and placed in a heat insulating container.

As a method of notifying occurrence of an abnormality of such a module, a method of detecting an abnormality of a battery by comparing electric discharge depth of each block, and notifying the abnormality has been disclosed (e.g., Japanese Laid-Open Patent Publication No. 03-158781). In this method, the presence or absence of the abnormality is determined for each of the blocks of the module. Therefore, in comparison with the case of detecting the abnormality for each of the NaS battery cells of each block, the apparatus is not complicated, and the production cost can be reduced advantageously.

SUMMARY OF THE INVENTION

It is considered that failures in the battery cells and thus failures in the modules are caused by internal short circuiting or external short circuiting in the battery cells.

For example, external short circuiting of the battery cells may be caused by formation of an external short circuiting loop due to leakage of active material in the battery cells. For example, internal short circuiting of the battery cells may be caused by damages, etc. of a beta tube.

External short circuiting and internal short circuiting of these battery cells can be detected by checking discharge depth in each block as can be seen from Japanese Laid-Open Patent Publication No. 03-158781. However, the discharge depth change does not occur rapidly, but occurs gradually over a relatively long period of time. Therefore, it is difficult to determine which module (or which block) has the abnormality, and initial response to the occurrence of the abnormality may be delayed undesirably.

The present invention has been made to take the problems of this type into account, and an object of the present invention is to provide an apparatus, a method, and a non-transitory recording medium for identifying a position of an abnormality having occurred in a secondary battery system, in which if an abnormality occurs, it is possible to identify a module (or a block) as the abnormality source at an early stage, and it is possible to implement an initial response to the occurrence of the abnormality at an early stage.

[1] An apparatus according to one aspect of the present invention is an apparatus for identifying a position of an abnormality having occurred in a secondary battery system including a plurality of modules each formed by accommodating one or more blocks in a casing. Each of the blocks is formed by connecting two or more secondary battery cells. The apparatus includes a voltage measurement unit configured to detect voltage of the secondary battery cells on a block by block basis, and output the detected voltage as block voltage, an information acquisition unit configured to acquire information about a module (module information) among the modules that which accommodates a block where a difference between the block voltage and a corresponding block voltage with a first order lag has been changed to exceed a predetermined voltage threshold value, a notification reception unit configured to receive a notification of an abnormality having occurred in the secondary battery cells, and a module identification unit configured to identify a module corresponding to the module information, as a module having the abnormality, at the time of receiving the notification by the notification reception unit.

Further, if external short circuiting or internal circuiting occurs in any one of the battery cells, the block voltage of the block including the short-circuited battery cell is decreased steeply. Thereafter, in some cases, after the elapse of a certain time period, the voltage returns to the original voltage level before short circuiting. Therefore, it is required to enhance the detection accuracy of the block voltage to check the voltage drop due to short circuiting from the change in the block voltage. For this purpose, in the present invention, information of a module (module information) among the modules that accommodates a block where the difference between the block voltage and the corresponding block voltage with a first order lag has changed to exceed a predetermined voltage threshold value is acquired. In this manner, it is possible to accurately detect whether or not the block voltage has been decreased, and detect occurrence of the abnormality due to short circuiting.

Therefore, in the present invention, by identifying the module which is the source of the abnormality, it becomes possible to give a notification to a local user, a local administrator, etc. Thus, it is possible to take action with regard to the identified abnormality source at an early stage. It becomes possible to prevent the damage from spreading.

[2] In the first aspect, a time constant of the first order lag may be selected depending on behavior where the block voltage drops temporarily due to short circuiting of at least one of the battery cells. For example, the time constant may be selected in consideration of a period where the block voltage is dropped (period from the beginning of the voltage drop to the beginning of the voltage rise) due to short circuiting of one battery cell. In this manner, it is possible to enhance the accuracy with which to detect the block subjected to temporary drop in the block voltage due to short circuiting of at least one battery cell.

[3] In the first aspect, as the voltage threshold value, a voltage value by which the block voltage temporarily drops due to short circuiting of at least one of the battery cells may be selected. In this manner, it is possible to improve the accuracy with which to detect the block whose block voltage has temporarily dropped due to short circuiting of at least one battery cell.

[4] In the first aspect, the apparatus may further include a current measurement unit configured to measure electric current of a module string formed by connecting the plurality of modules in series, and from among information about the modules included in the module string, the information acquisition unit may acquire information about a module (module information) that accommodates a block where the difference between the block voltage and the corresponding block voltage with the first order lag has been changed to exceed the voltage threshold value within a predetermined time period around a time point at which a difference between the present current measurement value and the previous current measurement value of the module string exceeds a predetermined current threshold value.

In this manner, it is possible to further improve the accuracy with which to detect the block suffering temporary drop in the block voltage due to short circuiting of at least one battery cell.

[5] In this case, as the current threshold value, a current variation range which occurs in the event of the voltage drop in the block voltage due to short circuiting of at least one of the battery cells may be selected.

In this manner, it is possible to further improve the accuracy with which to detect the block suffering temporary drop in the block voltage due to short circuiting of at least one battery cell.

[6] In the first aspect, the apparatus may further include an error output unit configured to receive the module information from the information acquisition unit, and output the module information together with an error message. In this manner, by outputting the module information together with an error message to a monitor and/or a printer, the position of the identified module can be recognized at a glance advantageously.

[7] A method according to a second aspect of the present invention is a method of identifying a position of an abnormality having occurred in a secondary battery system including a plurality of modules each formed by accommodating one or more blocks in a casing. Each of the blocks is formed by connecting two or more secondary battery cells. The method includes a voltage measurement step of detecting voltage of the secondary battery cells on a block by block basis, and outputting the detected voltage as block voltage, an information acquisition step of acquiring information about a module among the modules that accommodates a block where a difference between the block voltage and a corresponding block voltage with a first order lag has been changed to exceed a predetermined voltage threshold value, a notification reception step of receiving a notification of an abnormality having occurred in the secondary battery cells, and a module identification step of identifying a module corresponding to the module information, as a module having the abnormality, at the time of receiving the notification in the notification reception step.

[8] In the second aspect, a time constant of the first order lag may be selected depending on behavior where the block voltage drops temporarily due to short circuiting of at least one of the battery cells.

[9] In the second aspect, as the voltage threshold value, a voltage value by which the block voltage temporarily drops due to short circuiting of at least one of the battery cells may be selected.

[10] In the second aspect, the method may further include a current measurement step of measuring electric current of a module string formed by connecting the plurality of modules in series. In the information acquisition step, from among information about the modules included in the module string, information about a module (module information) that accommodates a block where the difference between the block voltage and the corresponding block voltage with the first order lag has been changed to exceed the voltage threshold value within a predetermined time period around a time point at which a difference between the present current measurement value and the previous current measurement value of the module string exceeds a predetermined current threshold value may be acquired.

[11] In this case, as the current threshold value, a current variation range which occurs in the event of the voltage drop in the block voltage due to short circuiting of at least one of the battery cells may be selected.

[12] In the second aspect, the method may further include an error output step of outputting the module information acquired in the information acquisition step together with an error message.

[13] A non-transitory recording medium according to a third aspect of the present invention is a non-transitory recording medium storing a program for a secondary battery system including a plurality of modules each formed by accommodating one or more blocks in a casing, the blocks each being formed by connecting two or more secondary battery cells, and a voltage measurement unit configured to detect voltage of the secondary battery cells on a block by block basis, and output the detected voltage as block voltage. The program is configured to enable the secondary battery system to function as an information acquisition unit configured to acquire information about a module (module information) among the modules that accommodates a block where a difference between the block voltage and a corresponding block voltage with a first order lag has been changed to exceed a predetermined voltage threshold value, a notification reception unit configured to receive a notification of occurrence of an abnormality in the secondary battery cells, and a module identification unit configured to identify a module corresponding to the module information, as a module having the abnormality, at the time of receiving the notification by the notification reception unit.

As described above, in the apparatus, the method, and the non-transitory recording medium for identifying a position where an abnormality occurs in a secondary battery system, according to the present invention, it is possible to identify a module (or a block) as the abnormality source at an early stage, and it is possible to take action against the occurrence of the abnormality at an early stage.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE INVENTION

Hereinafter, an apparatus, a method, and a non-transitory recording medium for identifying a position of an abnormality having occurred in a secondary battery system according to an embodiment of the present invention will be described with reference to FIGS. 1 to 8.

Figure 1:
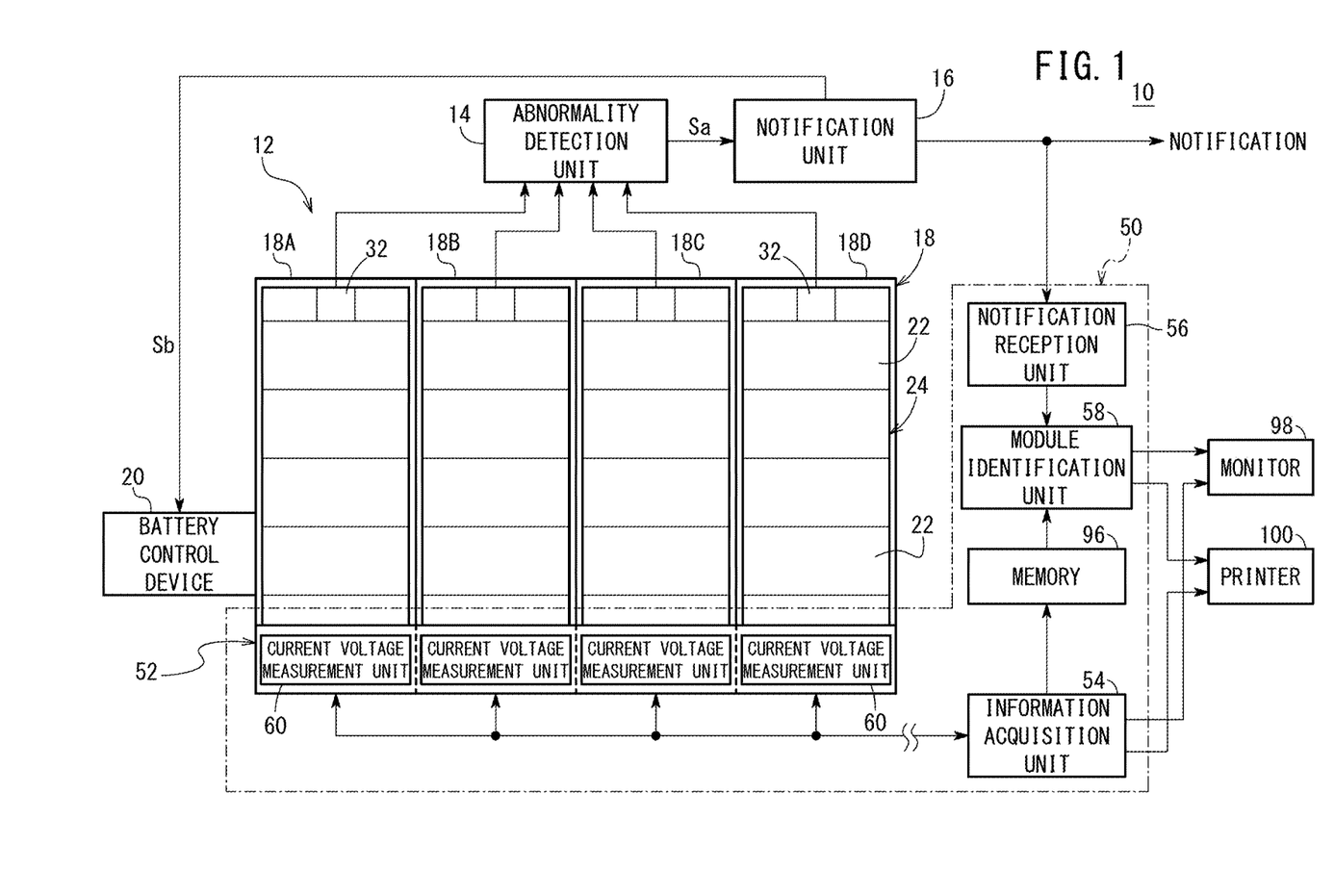
FIG. 1 is a configuration diagram showing a secondary battery system and an apparatus for identifying a position of an abnormality having occurred in a secondary battery system according to an embodiment of the present invention.

Firstly, as shown in FIG. 1, a secondary battery system 10, to which the apparatus, the method, and the non-transitory recording medium according to the embodiment of the present invention is applied, includes a secondary battery storage unit 12, an abnormality detection unit 14, and a notification unit 16.

The secondary battery storage unit 12 has a structure where a plurality of box shaped packages 18 are arranged in a lateral direction. In an example of FIG. 1, four packages 18 (first package 18A to fourth package 18D) are arranged in the lateral direction. Further, the secondary battery storage unit 12 has a battery control device 20 for controlling operation of the secondary batteries.

Two or more modules 22 are stacked in a vertical direction inside each of the packages 18. Further, each of the packages 18 accommodates a module string 24 formed by connecting the two or more modules 22 in series. In the structure of the example shown in FIG. 1, four modules 22 are stacked to form one module string 24.

Figure 2:
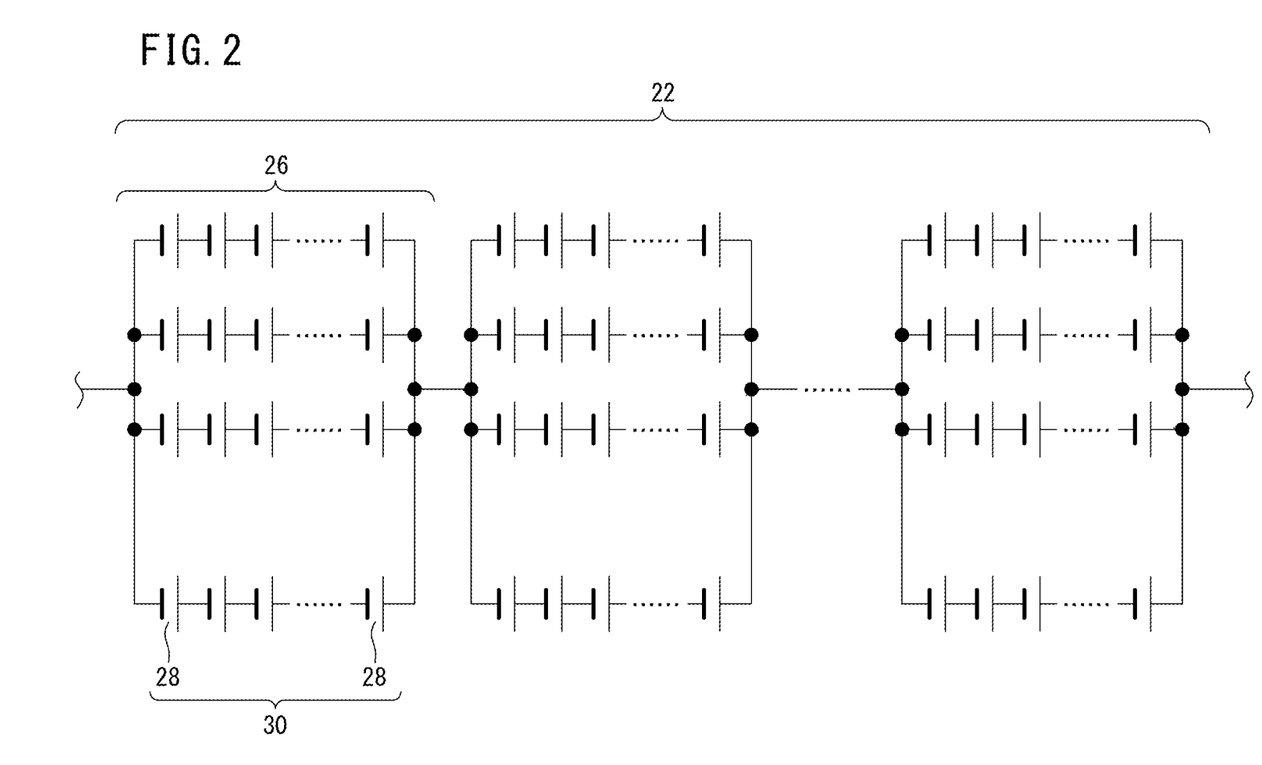
FIG. 2 is an equivalent circuit diagram showing a battery assembly included in a module.

As shown in FIG. 2, a battery assembly included in the module 22 is formed by connecting one or more blocks 26 in series. In an example of FIG. 2, three or more blocks 26 are connected. Each of the blocks 26 is formed by connecting two or more circuits (strings 30) in parallel, and each of the strings 30 is formed by connecting two or more secondary battery cells 28 in series. For example, eight cells 28 are connected in series to form one string 30, 12 strings 30 are connected in parallel to form one block 26, and four blocks 26 are connected in series to form one module 22. As the secondary battery, a NaS battery, a lithium ion battery, a sodium ion battery, etc. may be used.

The abnormality detection unit 14 detects abnormal conditions such as a fire based on signals from sensors 32 (heat sensor, smoke sensor, etc.) provided respectively in the packages 18.

The notification unit 16 outputs and transmits a notification (abnormality notification) indicating occurrence of an abnormality, to a monitoring center, etc., based on an input of an abnormality detection signal Sa (signal indicating occurrence of an abnormality) from the abnormality detection unit 14. In this case, the notification may be transmitted through a public communication network such as the Internet or a mobile phone network. Further, the notification may be transmitted to a local user, a local administrator, etc., in addition to the monitoring center.

Further, the notification unit 16 outputs an operation stop signal Sb to the battery control device 20 in addition to the above notification, based on the input of the abnormality detection signal Sa from the abnormality detection unit 14. The battery control device 20 stops operation of the secondary batteries in accordance with a predetermined sequence for stopping operation, based on input of the operation stop signal Sb.

Further, as shown in FIG. 1, an apparatus for identifying a position of an abnormality according to an embodiment of the present invention (hereinafter referred to as an abnormality identification apparatus 50) includes an information transmission unit 52, an information acquisition unit 54, a notification reception unit 56, and a module identification unit 58.

Figure 3:
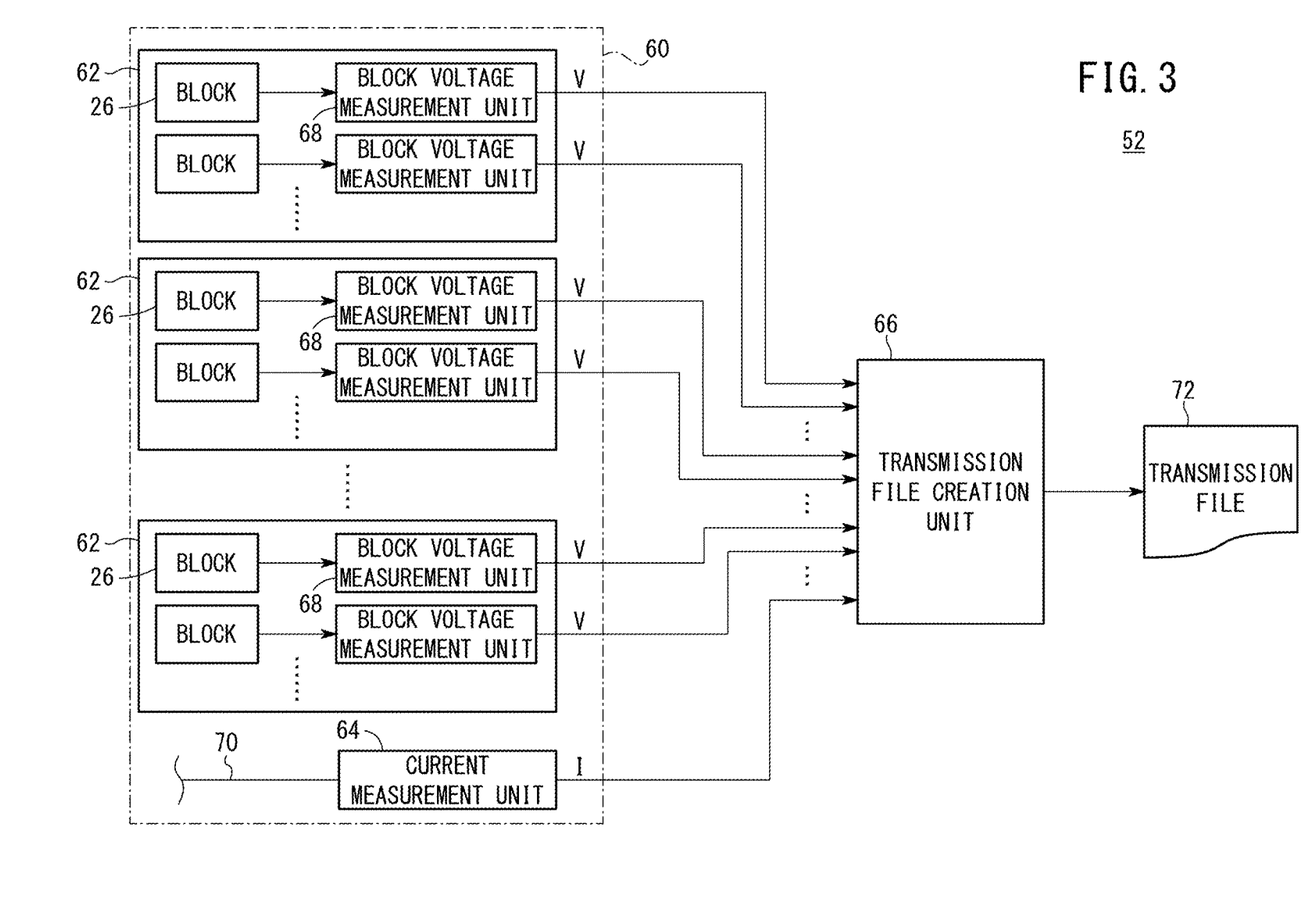
FIG. 3 is a block diagram showing structure of an information transmission unit.

The information transmission unit 52 has a plurality of current voltage measurement units 60 provided for the respective module strings 24. As shown in FIG. 3, each of the current voltage measurement units 60 includes a plurality of voltage measurement units 62 provided for the respective modules 22, one current measurement unit 64, and one transmission file creation unit 66.

The voltage measurement unit 62 has block voltage measurement units 68 provided for the respective blocks 26. Each of the block voltage measurement units 68 measures the voltage across the corresponding block 26 in accordance with a predetermining monitoring cycle. For example, the block voltage measurement unit 68 measures the voltage across the corresponding block 26 at a time interval optionally selected from a range between 0.5 to 2 seconds (e.g., one-second interval: monitoring cycle).

The current measurement unit 64 measures electric current of the corresponding module string 24 through a current measurement line 70 in accordance with the above described monitoring cycle.

Each of the transmission file creation units 66 creates a transmission file 72 including information about the corresponding module string 24 per one monitoring cycle. For example, the information about the module string 24 includes an identification number of the module string 24 (module string information), the present current measurement value I, information about a plurality of modules 22 included in the module string 24, etc. For example, the information about the module 22 includes an identification number of the module 22 (module information), identification numbers of a plurality of blocks 26 included in the module 22 (block information), the present block voltage values V corresponding to the respective blocks 26, etc.

Figure 4:
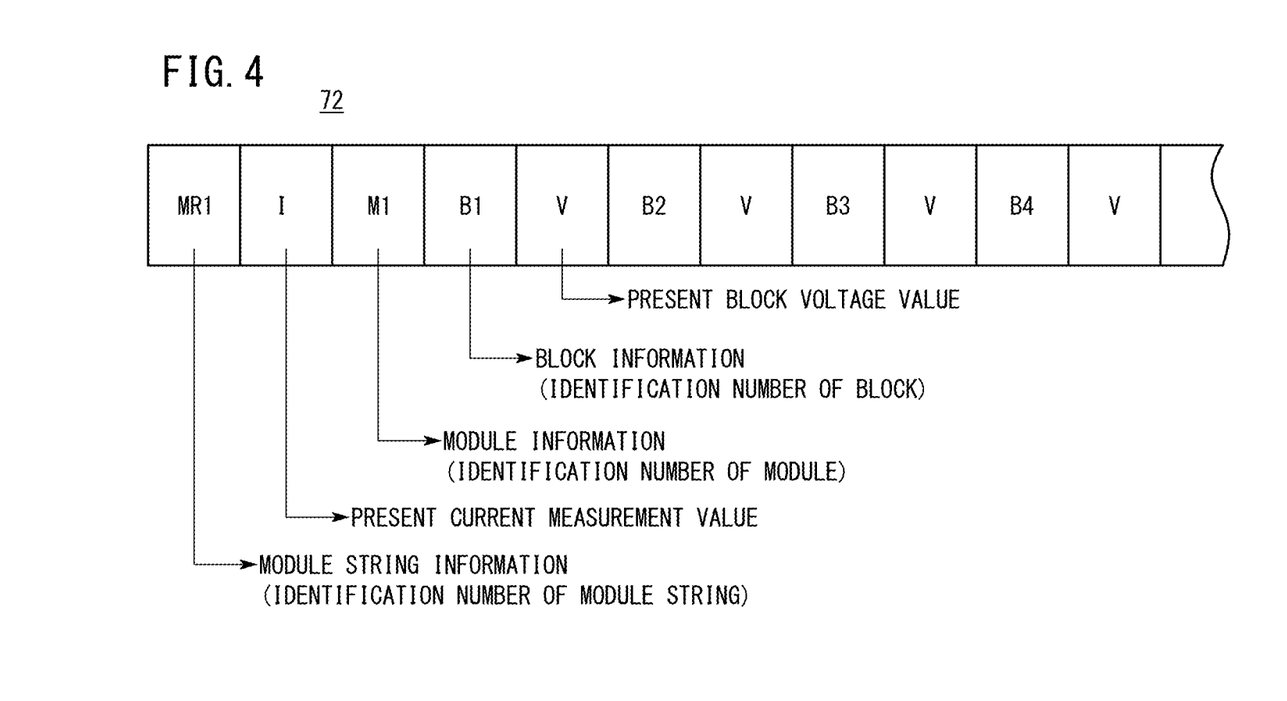
FIG. 4 is a diagram showing an example of a format of a transmission file.

As an example of a format of a transmission file 72, a format of the transmission file 72 associated with the first module string 24 is shown in FIG. 4. Specifically, in the order from the beginning, the format of the transmission file 72 includes an identification number (MR1) of the first module string 24, the present current measurement value I of the first module string 24, and information about a plurality of modules 22 included in the first module string 24.

As an example of the information about the modules 22, the format of information about the first module 22 includes an identification number (M1) of the first module 22, and information about a plurality of blocks 26 included in the module 22.

For example, the information about the plurality of blocks 26 includes the following items of information:
  (1a) Identification number of the first block 26 (B1)
  (1b) Present block voltage value V of the first block 26
  (1c) Identification number of the second block 26 (B2)
  (1d) Present block voltage value V of the second block 26
  (1e) Identification number of the third block 26 (B3)
  (1f) Present block voltage value V of the third block 26
  (1g) Identification number of the fourth block 26 (B4)
  (1h) Present block voltage value V of the fourth block 26

Figure 5:
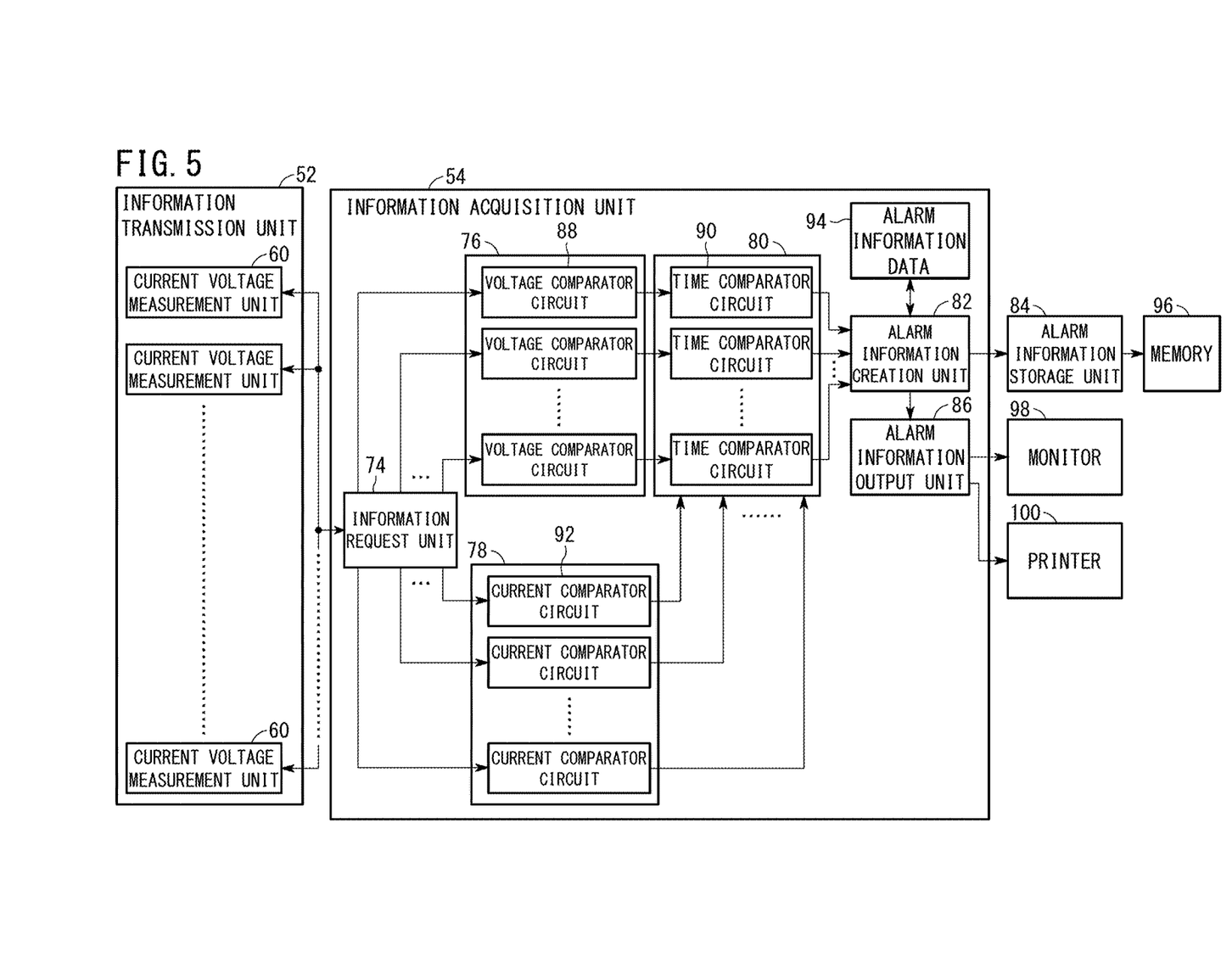
FIG. 5 is a block diagram showing structure of an information acquisition unit and the information transmission unit.

In the meanwhile, the information acquisition unit 54 grasps which module string 24 among the plurality of module strings 24 has a difference between the present current measurement value I and the previous current measurement value Ir (current difference value ΔI) that is greater than a predetermined current threshold value Ith. From among information about the plurality of modules 22 included in the grasped module string 24, the information acquisition unit 54 acquires information about a module 22 that accommodates therein a block 26 where the difference between the present block voltage V and the block voltage Vr with a first order lag (voltage difference value ΔV) has been changed to exceed a predetermined voltage threshold value Vth within a predetermined time period around the time point when the excess over the current threshold value Ith occurred.

Specifically, as shown in FIG. 5, the information acquisition unit 54 includes an information request unit 74, a voltage comparator unit 76, a current comparator unit 78, a time comparator unit 80, an alarm information creation unit 82, an alarm information storage unit 84, and an alarm information output unit 86.

The information request unit 74 requests each of the current voltage measurement units 60 of the information transmission unit 52 to transmit information per every monitoring cycle. Upon the transmission request of information from the information request unit 74, each of the current voltage measurement units 60 transmits the transmission file 72 including information about the corresponding module string 24, to the information acquisition unit 54.

The voltage comparator unit 76 includes a plurality of voltage comparator circuits 88 provided in correspondence with the plurality of blocks 26. Likewise, the time comparator unit 80 includes a plurality of time comparator circuits 90 provided in correspondence with the plurality of blocks 26.

Figure 6:
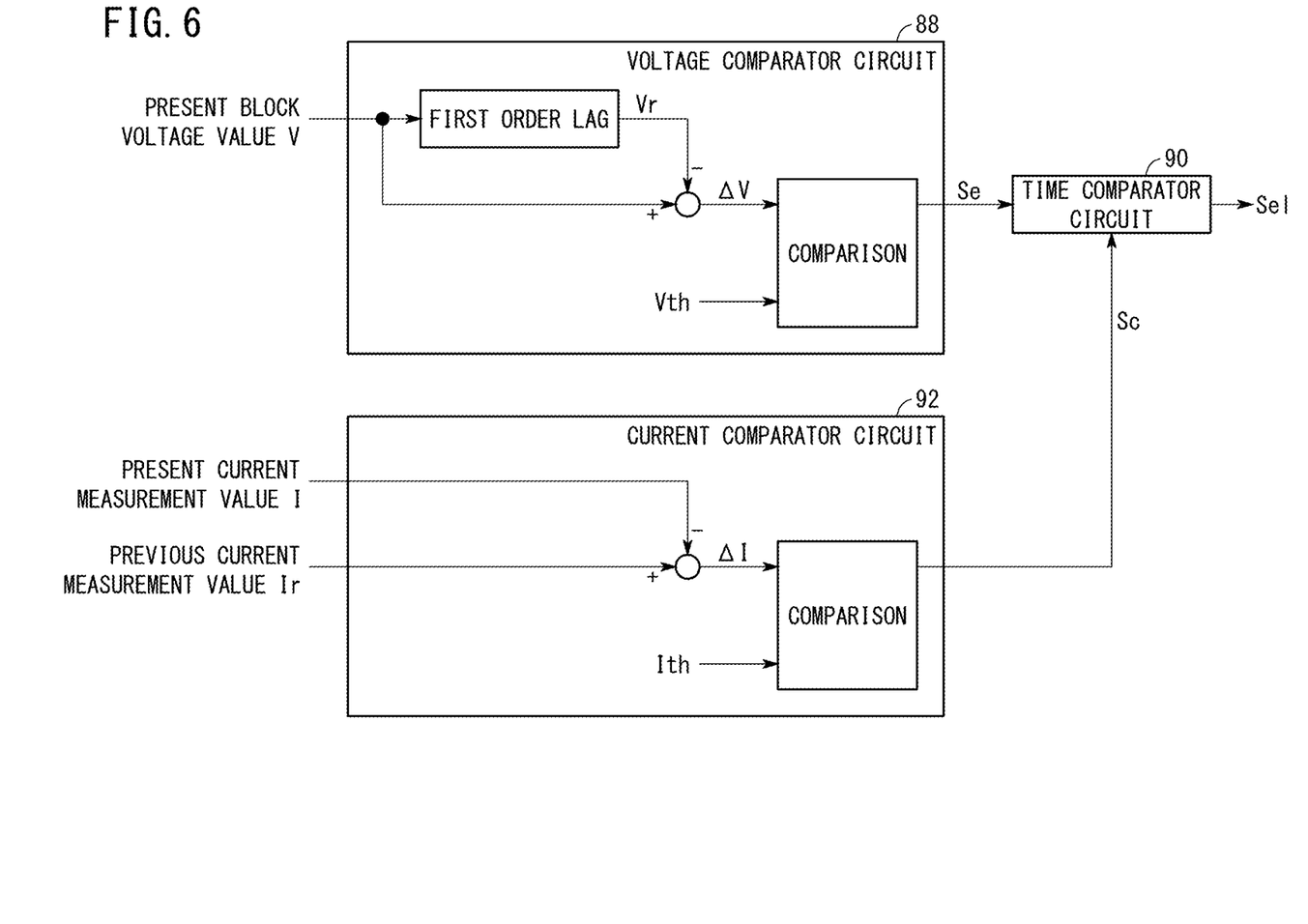
FIG. 6 is a block diagram showing structure of a voltage comparator circuit, a current comparator circuit, and a time comparator circuit.

The voltage comparator circuit 88 will be described, for example, with respect to one block. 26. As shown in FIG. 6, the voltage comparator circuit 88 takes difference between the block voltage V of the block 26 included in the acquired transmission file 72 and the block voltage Vr with its first order lag (voltage difference value ΔV). If the voltage difference value ΔV is equal to or greater than the predetermined voltage threshold value Vth, the voltage comparator circuit 88 outputs an event signal Se to the corresponding time comparator circuit 90. In the first order lag function $1-e^{-(t/TL)}$, one monitoring cycle (e.g., one second) may be selected as "t". For example, the time constant TL can be selected according to the behavior where due to short circuiting of one battery cell 28, the corresponding string 30 is insulated, and the block voltage V drops temporarily. For example, in the case of considering a period where the block voltage V is dropping (period from the beginning of the voltage drop to the beginning of the voltage rise) due to short circuiting of one battery cell 28, the time constant may be optionally selected from a range between 20 and 60 seconds, for example (e.g., 40 seconds). Further, as the voltage threshold value Vth, for example, a voltage value that is a temporary drop in the voltage due to short circuiting of one battery cell 28, e.g., 200 mV, may be selected.

The current comparator unit 78 has a plurality of current comparator circuits 92 provided in correspondence with the plurality of module strings 24. The current comparator circuit 92 will be described, for example, with respect to one module string 24. The current comparator circuit 92 takes the difference between the current measurement value I of the module string 24 included in the acquired transmission file 72 and the previous current measurement value Ir (current difference value ΔI). In the case where the current difference value ΔI is equal to or greater than the predetermined current threshold value Ith, the current comparator circuit 92 outputs a time comparison instruction signal Sc to the plurality of time comparator circuits 90 included in the module string 24. As the current threshold value Ith, for example, the range of current variation which occurs in the event of the voltage drop in the block voltage V due to short circuiting of single battery cell 28, e.g., 100 A, may be selected.

As described above, the time comparator unit 80 includes the plurality of time comparator circuits 90 provided in correspondence with the plurality of blocks 26. The time comparator circuit 90 will be described, for example, with respect to one block 26. As shown in FIG. 6, a time length Ta is compared with a predetermined time length (predetermined time Tb). The time length Ta herein means the time length between the time point at which the event signal Se from the corresponding voltage comparator circuit 88 is inputted and the time point at which the time comparison instruction signal Sc from the corresponding current comparator circuit 92 is inputted. If the time length Ta between these input time points is within the predetermined time period Tb, an event log signal Sel is outputted from the time comparator circuit 90 to the alarm information creation unit 82. No event log signal Sel is outputted in the following cases. As the predetermined time period Tb, for example, a time period in a range between 3 to 60 seconds (e.g., 10 seconds) may be optionally selected.
  (2a) Case where the time length Ta between the input time points exceeds the predetermined time period Tb;
  (2b) Case where no time comparison instruction signal Sc is inputted even after elapse of the predetermined time period Tb from the input time point of the event signal Se from the corresponding voltage comparator circuit 88; and (2C) Case where no event signal Se is inputted even after elapse of the predetermined time period Tb from the input time point of the time comparison instruction signal Sc from the corresponding current comparator circuit 92.

The alarm information creation unit 82 creates alarm information data 94 based on the input of the event log signal Sel outputted from the time comparator unit 80, and transmits the alarm information data 94 to the alarm information storage unit 84 and the alarm information output unit 86. For example, the following items of information are registered as the alarm information data 94:

(3a) Identification number of the module string 24 accommodating the block 26 corresponding to the time comparator circuit 90 that is an output source of the event log signal Sel (module string information);

(3b) Identification number of the module 22 (module information); and (3c) Identification number of the block 26 (block information).

Figure 7:
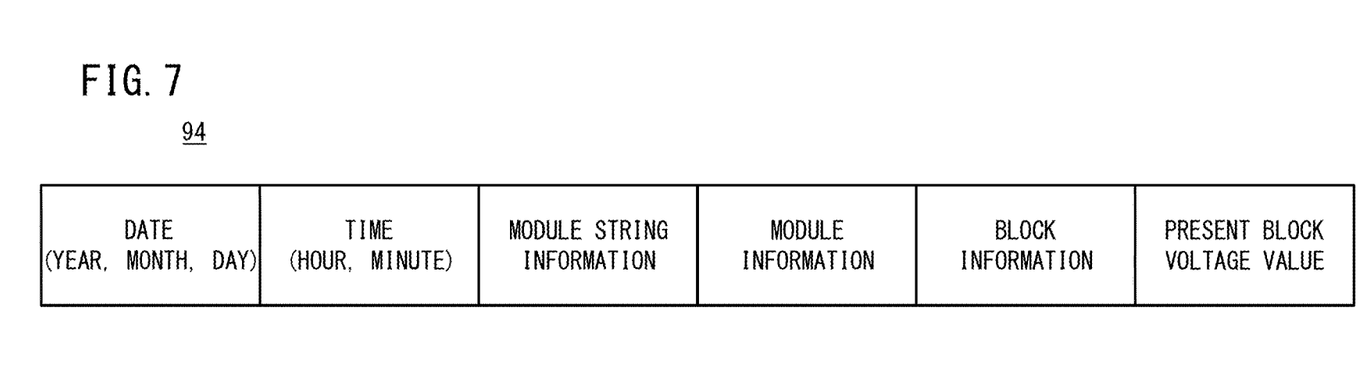
FIG. 7 is a diagram showing a format of alarm information data.

For example, as shown in FIG. 7, one piece of alarm information data 94 contains therein, from the beginning part, the present date (year, month, day), the present time (hour, minute), the module string information, the module information, the block information, and the present block voltage value V.

The alarm information storage unit 84 stores the alarm information data 94 created by the alarm information creation unit 82 in a memory 96 which adopts a stack method (last-in first-out method). Therefore, the alarm information data 94 retrieved from the memory 96 is the latest alarm information data 94.

The alarm information output unit 86 converts the alarm information data 94 transmitted successively from the alarm information creation unit 82 into display data and printing data, and outputs these items of data to a monitor 98 and a printer 100, respectively, together with an error message (such as a message "Short-circuiting abnormality has occurred."). Consequently, the alarm information (year, month, day, time, module string information, module information, block information, present block voltage value V) is displayed in chronological order together with the error message on the monitor 98, and printed by the printer 100 together with the error message.

In the meanwhile, as shown in FIG. 1, the notification reception unit 56 receives the notification (abnormality notification) indicating occurrence of an abnormality from the notification unit 16. Specifically, when the notification reception unit 56 receives the abnormality notification, the notification reception unit 56 starts operation of the module identification unit 58.

From among the plurality of modules 22, the module identification unit 58 identifies a module 22 corresponding to the module string information and the module information registered in the latest alarm information data 94, as a module 22 having the abnormality.

Specifically, operation of the module identification unit 58 is started by the notification reception unit 56, and the module identification unit 58 identifies the module 22 corresponding to the module string information and the module information registered in the latest alarm information data 94 stored in the memory 96, as a module 22 having the abnormality. The identification of the module 22 is notified to an operator or the like by outputting the module information and the error message (for example, "An accident occurred in the first module.") to the monitor 98 and/or the printer 100. Further, preferably, a schematic image of the secondary battery storage unit 12 with a symbol indicative of occurrence of the accident being placed at the position of the identified module 22 may be displayed on the monitor 98, or printed on a printing paper. In this manner, the position of the identified module 22 can be recognized at a glance.

Next, operation of the abnormality identification apparatus 50 according to an embodiment of the present invention will be described with reference to a flow chart in FIG. 8.

Figure 8:
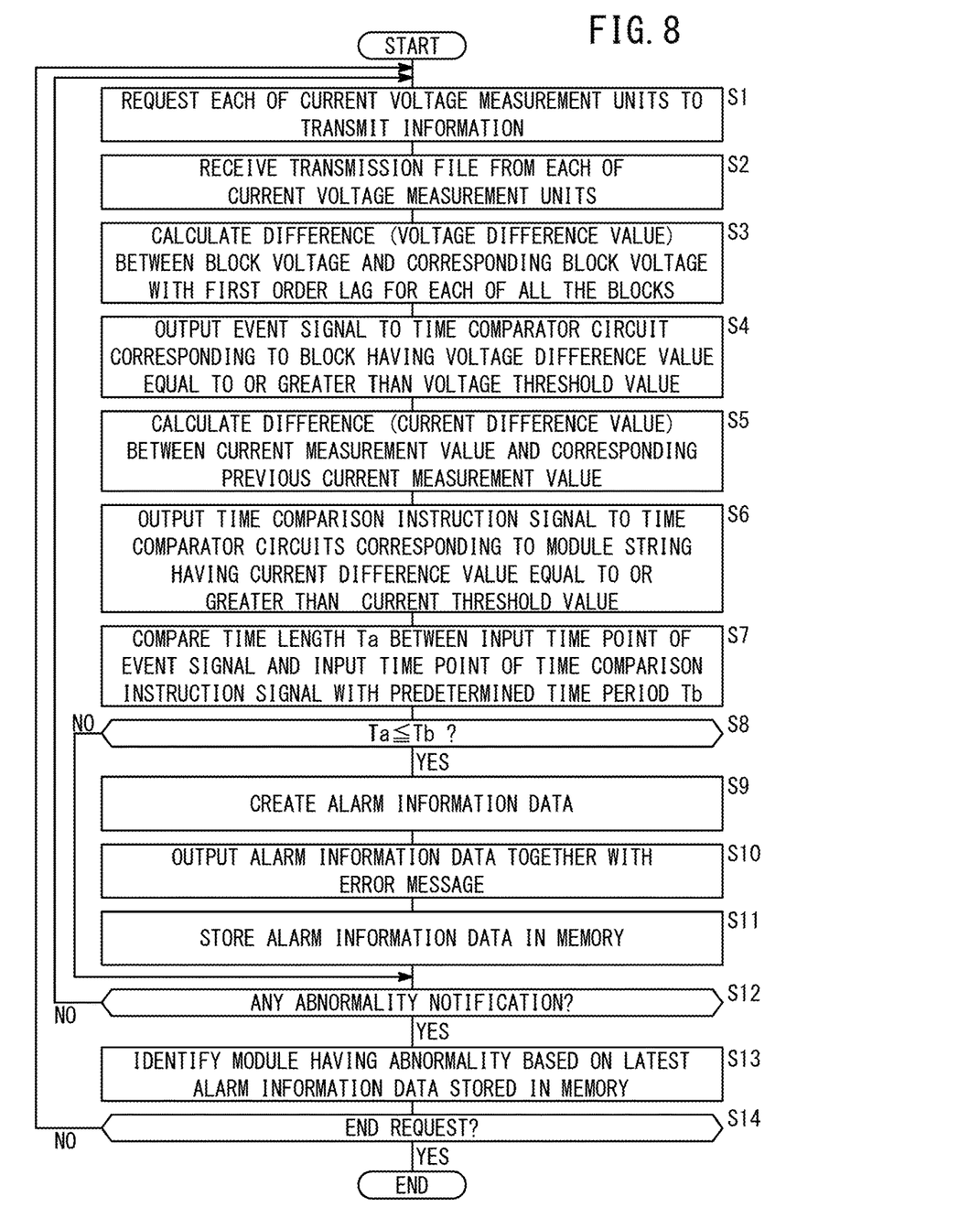
FIG. 8 is a flow chart showing an example of operations in the information acquisition unit, a module identification unit, and an information reception unit.

Firstly, in step S1 of FIG. 8, the information request unit 74 requests each of the current voltage measurement units 60 of the information transmission unit 52 to transmit information. Upon the transmission request from the information request unit 74, each of the current voltage measurement units 60 transmits a transmission file 72 including information about the corresponding module string 24 to the information acquisition unit 54.

In step S2, the information acquisition unit 54 receives the transmission file 72 from each of the current voltage measurement units 60.

In step S3, the voltage comparator unit 76 of the information acquisition unit 54 calculates the difference (voltage difference value ΔV) between the block voltage V and the corresponding block voltage Vr with a first order lag, for each of all of the blocks 26 included in the acquired transmission file 72.

In step S4, the voltage comparator unit 76 outputs an event signal Se to a time comparator circuit 90 corresponding to a block 26 among the blocks 26 that has a voltage difference value ΔV equal to or greater than the voltage threshold value Vth.

In the meanwhile, in step S5, the current comparator unit 78 of the information acquisition unit 54 calculates the difference (current difference value ΔI) between the current measurement value I and the corresponding previous current measurement value Ir, for each of all the module strings 24 included in the acquired transmission file 72.

In step S6, the current comparator unit 78 outputs a time comparison instruction signal Sc to a plurality of time comparator circuits 90 corresponding to a module string 24 among the module strings 24 that has a current difference value ΔI equal to or greater than the current threshold value Ith.

In step S7, among the time comparator circuits 90 in the time comparator unit 80, a time comparator circuit 90 that has received the inputs of the event signal Se and the time comparison instruction signal Sc compares a time length Ta between the input time point of the event signal Se and the input time point of the time comparison instruction signal Sc with the predetermined time length (predetermined time period Tb).

In step S8, if the time length Ta between the input time points is within the predetermined time period Tb, an event log signal Sel is outputted from the time comparator circuit 90 to the alarm information creation unit 82.

In step S9, the alarm information creation unit 82 creates the alarm information data 94. Specifically, the alarm information creation unit 82 creates the alarm information data 94 containing the following items of information:

(4a) Present date and time;

(4b) Identification number of the module string 24 accommodating the block 26 corresponding to the time comparator circuit 90 that is an output source of the event log signal Sel (module string information);

(4c) Identification number of the module 22 (module information); and (4d) Identification number of the block 26 (block information).

In step S10, the alarm information output unit 86 converts the created alarm information data 94 into display data and printing data, and outputs these items of data to the monitor 98 and the printer 100, respectively, together with an error message (such as a message "Short-circuiting abnormality has occurred.").

In step S11, the alarm information storage unit 84 stores the alarm information data 94 created by the alarm information creation unit 82 in the memory 96 which adopts a stack method (last-in first-out type).

In step S12, the notification reception unit 56 determines whether there is any notification (abnormality notification) indicating occurrence of an abnormality from the notification unit 16. If no abnormality notification has been received, the routine returns to step S1 to repeat the processes of step S1 and the subsequent steps.

If any abnormality notification has been received, the routine proceeds to the next step S13 to perform processes in the module identification unit 58. Specifically, the module identification unit 58 identifies a module 22 that corresponds to the module string information and the module information registered in the latest alarm information data 94 stored in the memory 96, as a module 22 having the abnormality. Then, the module identification unit 58 outputs the module information and the error message regarding the identified module 22 to the monitor 98 and/or the printer 100.

In step S14, it is determined whether or not there is a request for stopping operation of the information acquisition unit 54 (e.g., end request due to interruption of the power supply, maintenance operation, etc.). If there is no request for stopping operation, the routine returns to step S1 to repeat the processes of step S1 and the subsequent steps. On the other hand, if there is a request for stopping operation, then the operation of the information acquisition unit 54 is ended. Incidentally, step S3 and step S4 may be performed between step S6 and step S7.

As described above, in the abnormality identification apparatus 50 and the abnormality identification method according to the embodiment of the present invention, the following processes are performed:

(5a) Information about a module 22 among the plurality of modules 22 that accommodates a block 26 where the difference between the present block voltage V and the block voltage Vr with a first order lag (voltage difference value ΔV) has been changed to exceed a predetermined voltage threshold value Vth, is acquired to create the alarm information data 94; and (5b) At the time of receiving the abnormality notification in the notification reception unit 56, a module 22 corresponding to at least the latest alarm information data 94 is identified as a module 22 having the abnormality.

In this manner, by identifying the module 22 which is the source of the abnormality, it becomes possible to give a notification to a local user, a local administrator, etc. Therefore, it is possible to take action with regard to the identified abnormality source at an early stage. It becomes possible to prevent the damage from spreading.

Further, if external short circuiting or internal short circuiting occurs in any one of the battery cells 28, the block voltage V of the block 26 including the short-circuited battery cell 28 is decreased steeply. Thereafter, in some cases, after the elapse of 1.5 to 2 minutes, the voltage returns to the original voltage level before short circuiting. Therefore, it is required to enhance the detection accuracy of the block voltage in order to check the voltage drop due to short circuiting from the change in the block voltage.

For this purpose, in the embodiment of the present invention, information (module information) about a module 22 among the modules 22 that accommodates a block 26 where the difference between the present block voltage V and the block voltage Vr with a first order lag (voltage difference value ΔV) has been changed to exceed a predetermined voltage threshold value Vth is acquired. In this manner, it is possible to accurately detect whether or not the block voltage V has been decreased, and detect occurrence of the abnormality due to short circuiting.

Further, in the embodiment of the present invention, the time constant of the first order lag is selected depending on the behavior of the temporary drop in the block voltage V due to short circuiting of at least one battery cell 28. Further, as the voltage threshold value Vth, for example, a voltage value by which the block voltage V temporarily drops due to short circuiting of at least one battery cell 28 is selected. In this manner, it is possible to enhance the accuracy with which to detect a block 26 whose block voltage V has temporarily dropped due to short circuiting of at least one battery cell 28.

Further, from among the information about the plurality of modules 22 included in the module string 24, the information acquisition unit 54 of the embodiment of the present invention acquires information about a module 22 that accommodates a block 26 where the difference between the present block voltage V and the block voltage Vr with a first order lag (voltage difference value ΔV) has been changed to exceed a predetermined voltage threshold value Vth within a predetermined period of time around a predetermined time point. The predetermined time point is a time point when the difference (current difference value ΔI) between the present current measurement value I and the previous current measurement value Ir of the module string 24 exceeds the predetermined current threshold value Ith. In this manner, it is possible to further enhance the accuracy with which to detect the block 26 whose block voltage V has temporarily dropped due to short circuiting of at least one battery cell 28.

It is a matter of course that the apparatus, the method, and the non-transitory recording medium for identifying a position of an abnormality having occurred in a secondary battery system according to the embodiment of the present invention is not limited to the embodiments described above, and various structures can be adopted without deviating from the scope of the present invention.

What is claimed is:

1. A secondary battery system including a plurality of modules each formed by accommodating one or more blocks in a casing, the blocks each being formed by connecting two or more secondary battery cells, the secondary battery system comprising:
   a block voltage measurement unit configured to detect voltage of the secondary battery cells of each block in accordance with a predetermined monitoring cycle, and output the detected voltages as respective block voltages for each block;
   an information acquisition unit configured to receive the respective block voltages for each block, determine, for each block voltage, whether a difference between the respective block voltage and a corresponding block voltage with a first order lag exceeds a predetermined voltage threshold value, and acquire information about a module among the plurality of modules that accommodates the block of which the difference has been determined as exceeding the voltage threshold value;

a notification reception unit configured to receive a notification of an abnormality having occurred in the secondary battery cells;

a module identification unit configured to identify at time of receiving the notification of the abnormality having occurred in the secondary battery cells by the notification reception unit, the module among the plurality of modules corresponding to the information about the module among the plurality of modules, as the module among the plurality of modules having the abnormality; and an error output unit configured to receive the information about the module among the plurality of modules from the information acquisition unit, and output the information about the module among the plurality of modules together with an error message.

2. The secondary battery system according to claim 1, wherein a time constant of the first order lag is set depending on behavior where the block voltage drops temporarily due to short circuiting of at least one of the battery cells.

3. The secondary battery system according to claim 1, wherein, as the voltage threshold value, a voltage value by which the block voltage temporarily drops due to short circuiting of at least one of the battery cells is set.

4. The secondary battery system according to claim 1, further comprising a current measurement unit configured to measure electric current of a module string formed by connecting the plurality of modules in series, wherein, from among the plurality of modules included in the module string, the information acquisition unit acquires information about the module among the plurality of modules that accommodates a block where the difference between the respective block voltage and the corresponding block voltage with the first order lag exceeds the voltage threshold value within a predetermined time period around a time point at which a difference between a present current measurement value and a previous current measurement value of the module string exceeds a predetermined current threshold value.

5. The secondary battery system according to claim 4, wherein as the current threshold value, a current variation range which occurs when the block voltage drops due to short circuiting of at least one of the battery cells is set.

6. A method of identifying an abnormality having occurred in a secondary battery system, the secondary battery system including a plurality of modules each formed by accommodating one or more blocks in a casing, the blocks each being formed by connecting two or more secondary battery cells, the secondary battery system comprises: a block voltage measurement unit; an information acquisition unit; a notification reception unit; a module identification unit; and an error output unit;

the method comprising:

a voltage measurement step, in the block voltage measurement unit, of detecting voltage of the secondary battery cells of each block in accordance with a predetermined monitoring cycle, and outputting the detected voltages as respective block voltages for each block;

an information acquisition step, in the information acquisition unit, of receiving the respective block voltages for each block, determining, for each block voltage, whether a difference between the respective block voltage and a corresponding block voltage with a first order lag exceeds a predetermined voltage threshold value, and acquiring information about a module among the plurality of modules that accommodates the block of which the difference has been determined as exceeding the voltage threshold value;

a notification reception step, in the notification reception unit, of receiving a notification of an abnormality having occurred in the secondary battery cells;

a module identification step, in the module identification unit, of identifying, at the time of receiving the notification of the abnormality having occurred in the secondary battery cells, the module among the plurality of modules corresponding to the information about the module among the plurality of modules, as the module among the plurality of modules having the abnormality; and an error output step, in the error output unit, of outputting the information about the module among the plurality of modules acquired in the information acquisition step together with an error message.

7. The method according to claim 6, wherein a time constant of the first order lag is set depending on behavior where the block voltage drops temporarily due to short circuiting of at least one of the battery cells.

8. The method according to claim 6, wherein, as the voltage threshold value, a voltage value by which the block voltage temporarily drops due to short circuiting of at least one of the battery cells is set.

9. The method according to claim 6, further comprising a current measurement step of measuring electric current of a module string formed by connecting the plurality of modules in series, wherein in the information acquisition step, from among the plurality of modules included in the module string, information about the module among the plurality of modules that accommodates a block where the difference between the respective block voltage and the corresponding block voltage with the first order lag exceeds the voltage threshold value within a predetermined time period around a time point at which a difference between a present current measurement value and a previous current measurement value of the module string exceeds a predetermined current threshold value is acquired.

10. The method according to claim 9, wherein as the current threshold value, a current variation range which occurs when the block voltage drops due to short circuiting of at least one of the battery cells is set.

* * * * *